United States Patent [19]
Allen

[11] Patent Number: 5,949,269
[45] Date of Patent: Sep. 7, 1999

[54] METHOD AND APPARATUS TO REDUCE SIGNAL DELAY MISMATCH IN A HIGH SPEED INTERFACE

[75] Inventor: Michael J. Allen, Rescue, Calif.

[73] Assignee: Intel Corporation, Santa Clara, Calif.

[21] Appl. No.: 08/782,601

[22] Filed: Jan. 13, 1997

[51] Int. Cl.⁶ .................................................. H03K 5/13
[52] U.S. Cl. .......................... 327/285; 327/263; 326/31
[58] Field of Search ..................................... 327/261, 262, 327/263, 264, 266, 288, 284, 285, 362, 108, 379, 378; 26/21, 31, 23, 34

[56] References Cited

U.S. PATENT DOCUMENTS 4,890,016  12/1989  Tanka et al. ............................. 307/443
5,130,582   7/1992  Ishihara et al. .......................... 327/263

Primary Examiner—Timothy P. Callahan
Assistant Examiner—Eunja Shin
Attorney, Agent, or Firm—Blakely, Sokoloff, Taylor & Zafman

[57] ABSTRACT

A device for compensating a signal delay introduced by a second circuit is provided. The second circuit is configured to receive a signal and to output the signal with the first delay if the first signal transitions from a first to a second logic level. The second circuit is configured to output the signal with the second delay if the first signal transitions from the second to the first logic level. The device according to the present invention includes a first circuit that is configured to receive the signal. The first circuit is configured to introduce the first delay, if the signal transitions from a second to a first logic level. The first circuit is configured to introduce the second delay if the signal transitions from the first to the second logic level.

14 Claims, 7 Drawing Sheets

METHOD AND APPARATUS TO REDUCE SIGNAL DELAY MISMATCH IN A HIGH SPEED INTERFACE

BACKGROUND OF THE INVENTION (1) Field of the Invention

The present invention relates to the field of interfaces. More specifically, the present invention relates to high speed interfaces.

(2) Description of Related Art

High speed interfaces handle signals transmitted at very high data rates. Such signals may incur a considerable time delay when transmitted through data paths of different lengths, particularly in high speed interfaces when a small difference in the length of data paths may cause substantial delay between signals transmitted at high data rates. For example, a 4-inch difference between two data paths carrying the same signal can cause approximately one nanosecond delay in arrival time of the signals. Typically, a PC board introduces a delay of approximately 250 picoseconds per inch of signal trace.

Additionally, high speed interfaces include heavy duty output buffers that may cause significant signal delays due to their large size driver transistors. Such transistors may introduce significant delays when signals transition from a high logic level to a low logic level and vice versa. Typically, the delay introduced by an output buffer when a data signal transitions from high to low is different than when the same signal transitions from low to high. Consequently, when a data signal and a corresponding 180° dephased version are driven by an output buffer, a delay between these signals may ensue such that they do not arrive at a sample point at the same time.

FIG. 1 diagrammatically illustrates a DATA signal 102, a $\overline{\text{DATA}}$ signal 104 dephased 180° relative to the DATA signal 102, and a strobe (STB) signal 106 sampling signals 102 and 104. These signals are driven by an output buffer of a high speed interface circuit. In this example, the DATA and $\overline{\text{DATA}}$ signals are sampled when the STB signal 106 transitions from low to high (rising edge). DATA signal 102 and $\overline{\text{DATA}}$ signal 104 are strobed by the rising edge 108 of the STB signal 106 at a median part 116 (shown in dotted line) of a window 114 created by the DATA and $\overline{\text{DATA}}$ signals. In high speed interfaces, the window 114 has a width 110 that becomes smaller and smaller as the rate at which signals 102 and 104 are transmitted (i.e., the data rate) increases. As width 110 decreases, the likelihood that data is inaccurately strobed at the arrival point becomes higher. For example, assuming that an output buffer (not shown) causes delay 118 in the $\overline{\text{DATA}}$ signal transitioning from high to low, rising edge 108 of STB signal 106 may sample the $\overline{\text{DATA}}$ signal 104 at a time when it is not stable (i.e., it is transitioning), thereby causing confusion as to its logic state at its destination. Additionally, signals DATA and $\overline{\text{DATA}}$ arrive at a sample point at slightly different times. This is referred to herein as signal delay mismatch.

It is desirable to provide an apparatus and method for reducing signal delay mismatch in high speed interfaces thereby providing more accurate data transmission through such interfaces.

BRIEF SUMMARY OF THE INVENTION

The present invention provides a device for compensating a signal delay introduced by a second circuit. The second circuit is configured to receive a signal and to output the signal with the first delay if the first signal transitions from a first to a second logic level. The second circuit is configured to output the signal with the second delay if the first signal transitions from the second to the first logic level. The device according to the present invention includes a first circuit that is configured to receive the signal. The first circuit is configured to introduce the first delay, if the signal transitions from a second to a first logic level. The first circuit is configured to introduce the second delay if the signal transitions from the first to the second logic level.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

Figure 1:
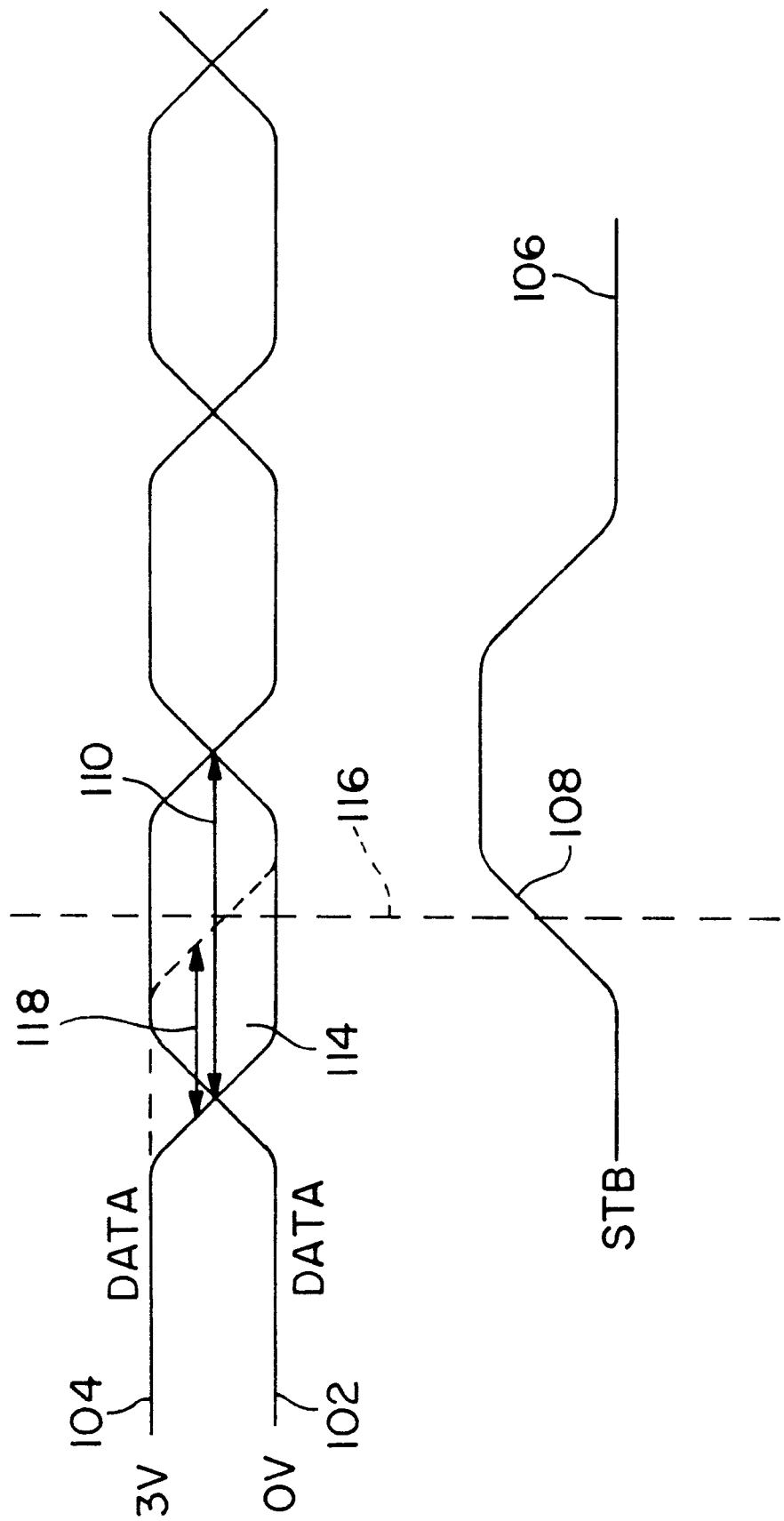
FIG. 1 diagrammatically illustrates signal wave forms in a conventional interface circuit.
Figure 2:
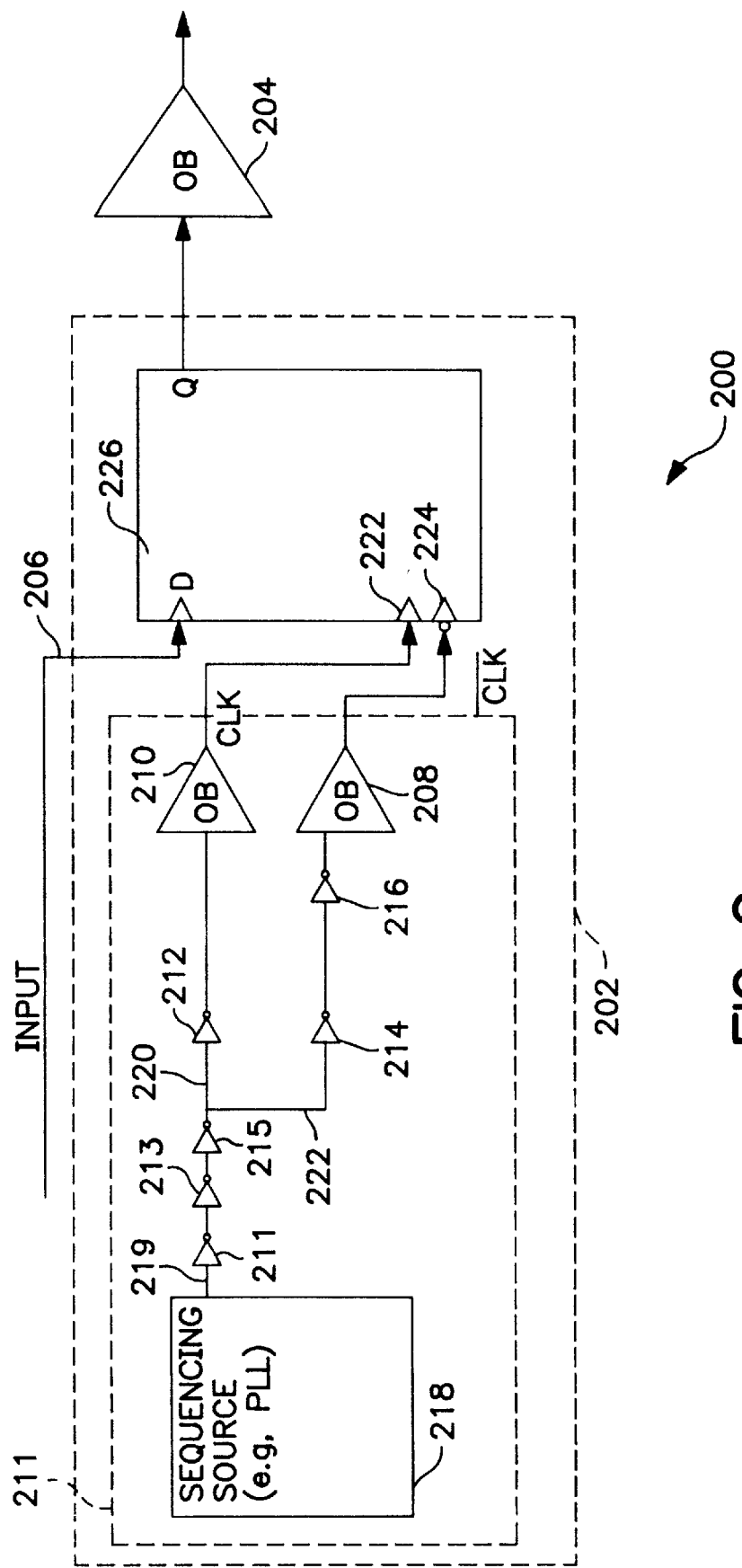
FIG. 2 illustrates a block diagram of a of a device according to one embodiment of the present invention.

FIG. 2 illustrates a block diagram of a device for compensating signal delay mismatch 200 according to the present invention. The device 200 includes a first circuit 202 coupled to a second circuit 204. In one embodiment of the present invention, the second circuit 204 includes a heavy duty output buffer but the present invention is not limited to such device.

An output buffer such as 204 coupled to first circuit 202 receives a first signal (hereinafter "input signal") and outputs this signal with a first delay, i.e. introduces a first time delay in the path of the input signal, when the input signal transitions from a first to a second logic level. The output buffer 204 also outputs the input signal with a second delay when the input signal transitions from a second to a first logic level. Typically, output buffer 204 includes large size driver transistors that introduce a considerable time delay. The first and second delays are typically different. In the following discussion the first logic level corresponds to a low logic level, i.e., 0 logic, while the second logic level corresponds to a high logic level, i.e., logic 1. In one embodiment of the present invention, the input signal may be a data signal from a data path, but the present invention applies to any signal transmission.

In the present invention, instead of sending the input signal directly to output buffer 204, the signal is first driven to first circuit 202 prior to its being input to output buffer 204. An output of first circuit 202 is coupled to an input of output buffer 204. The input signal is output by first circuit 202 with a first time delay (hereinafter "first delay") when the input signal transitions from a second to a first logic level or with a second delay when the input signal transitions from the first logic level to the second logic level.

Circuit 202 includes clock delay circuit 211 that comprises a sequencing source 218 that generates a sequencing signal 219 (hereinafter "clock signal 219"). In one embodiment of the present invention, sequencing source 218 (hereinafter "clock source") may include a Phased Locked Loop that has a modular counter coupled between a voltage control oscillator's (VCO) output and a phase detector. The clock source 218 drives the clock signal to first and second clock branches 220 and 222 through a series of inverters 211, 213, and 215. Branch 220 includes inverter 212 while branch 222 includes serially coupled inverters 214 and 216. The clock signal driven to the output of inverter 212 has the same phase as the clock signal generated at the output of clock source 218, as the clock signal passes through an even number of inverters before arriving to the output inverter 212. However, the clock signal driven to the output of inverter 216 is dephased 180° with respect to the clock signal driven to the output of inverter 212, as the clock signal passes through an odd number of inverters before arriving at the output of inverter 216.

Circuit 202 further includes a first clock delay stage 210 and a second clock delay stage 208 coupled to the outputs of inverters 212 and 216 respectively. In one embodiment of the present invention, first and second clock delay stages 210 and 208 include output buffers substantially identical with output buffer 204. Output buffers 210 and 208 output CLK and $\overline{CLK}$ signals respectively, where $\overline{CLK}$ is dephased by 180° with respect to CLK. Output buffers 210 and 208 apply the same delay time as the output buffer 204 to signals input thereto. Accordingly, output buffers 210 and 208 delay signals received at their input by a first delay time if these signals transition from a first logic level to a second logic level. Also, output buffers 210 and 208 delay the signals received at their input by a second delay time if these signals transition from the second logic level to the first logic level.

In one embodiment of the present invention, circuit 202 further includes a third circuit 226 (hereinafter referred to as a "muxflop circuit"). Muxflop is defined herein as a circuit that includes at least one selecting device such as a multiplexor, and at least one latch such as a flip-flop. Muxflop circuit 226 receives the CLK and $\overline{CLK}$ signals at clock inputs 222 and 224 respectively. Muxflop circuit 226 also receives the input signal via line 206. For each transition of the input signal, high-to-low or low-to-high, muxflop circuit 226, in conjunction with the clocking scheme explained above, introduces a delay that output buffer 204 would introduce in the input signal's path if the input signal transitioned in the opposite direction. For example, for a transition of the input signal from low to high, the output buffer 204 would introduce the first delay while the muxflop circuit 226 would introduce the second delay.

Figure 3:
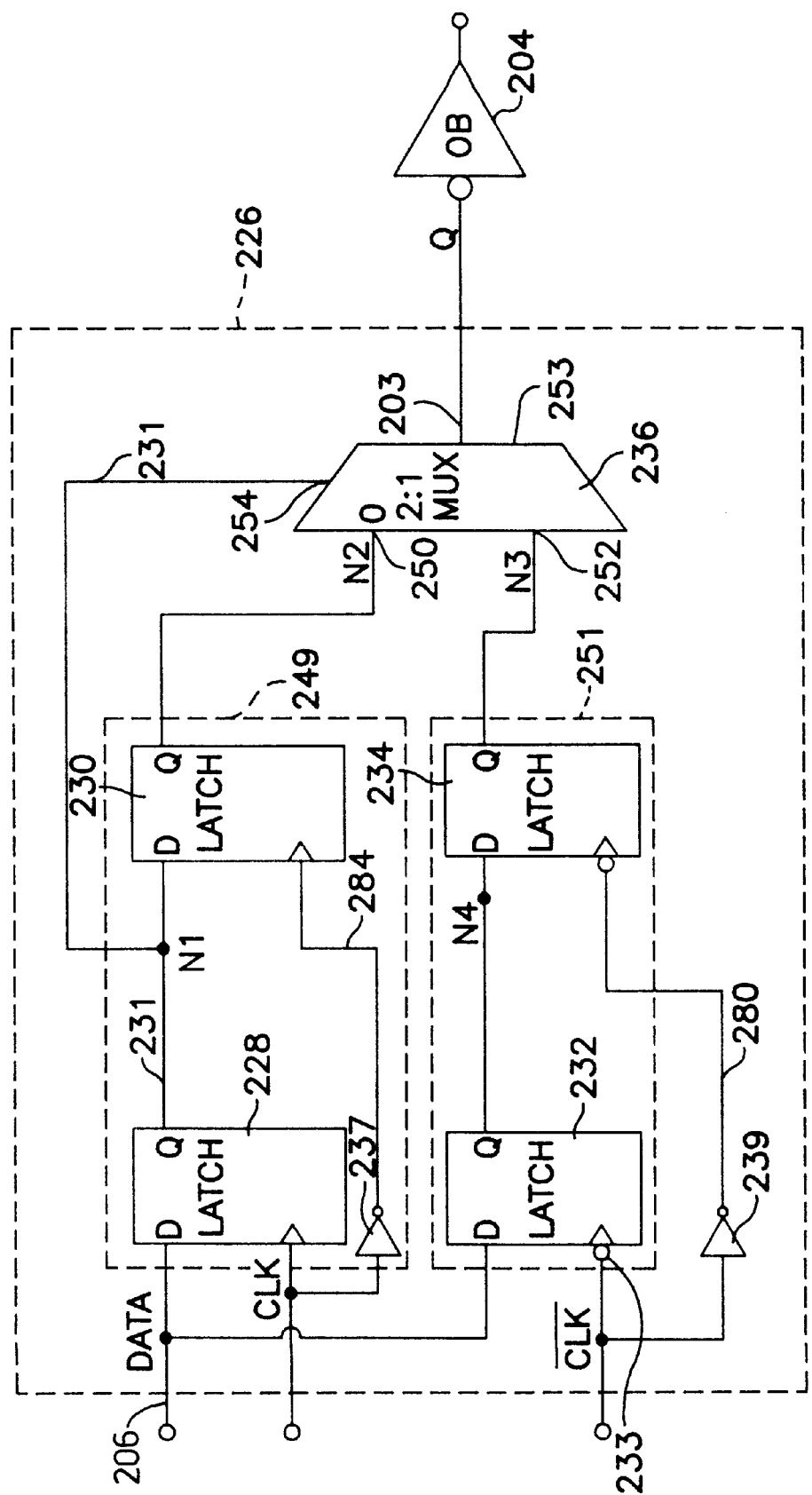
FIG. 3 illustrates a circuit included in the device of FIG. 2 according to one embodiment of the present invention.

FIG. 3 illustrates one embodiment of muxflop 226. Muxflop 226 includes first and second delay stages 249 and 251 respectively. The first delay circuit receives the input signal and the CLK signal which sequences the operation of the first delay circuit. When the CLK signal transitions from low to high, the first delay stage latches the value of the input signal and drives this signal to an output thereof. The second delay stage 251 receives the input signal and the $\overline{CLK}$ signal which sequences the operation of the second delay circuit. When the $\overline{CLK}$ signal transitions from high to low, the second delay circuit 251 latches the value of the input signal and drives this signal to an output thereof.

First delay stage 249 includes a master latch 228 and a slave latch 230 coupled thereto. In one embodiment according to the present invention, latches 228 and 230 are D flip-flops. Accordingly, latch 228 has an input (D) that receives the input signal via line 206 and an output (Q) that outputs the input signal latched in latch 228 when the CLK signal generated by output buffer 210 (FIG. 2) transitions from low to high. Second delay stage 251 includes master latch 232 and slave latch 234 coupled therebetween. A data input of latch 232 receives the input signal via line 206, while a clock input of latch 232 receives the $\overline{CLK}$ signal generated by output buffer 208 (shown in FIG. 2).

Muxflop 226 also includes a selecting device 236 which, in the embodiment discussed herein, is a multiplexor. Multiplexor 236 has a first input 250 coupled to output (Q) of latch 230 and a second input 252 coupled to output (Q) of latch 234. Furthermore, multiplexor 236 has a control input 254 coupled to the output of latch 228 at node N1. Depending on the logic state of the input signal at node N1, multiplexor 236 selectively gates one of the signals received at its inputs to its output 203. Accordingly, the signal selected at output 203 of multiplexor 236 is a signal having a compensating delay introduced by one of the output buffers 210 and 208 (not shown in this figure).

Assuming that the input signal transitions from low to high, latch 228 latches the input signal (high) on the next transition of the CLK signal from low to high. Accordingly, after the clock-to-Q propagation delay time introduced by latch 228 node N1 is set to a high logic level ("1"). The propagation delay through latch 228, however, is negligible relative to the first time delay introduced by the CLK signal. The signal at node N1 is then latched by latch 230 after the CLK signal is driven via inverter 237 to a clock input of latch 230. Note that latch 230 latches data upon transition from high to low of the clock signal received at the input of this latch. As soon as data at node $N_1$ changes from low to high, the control input of multiplexor 236 also changes to high. The signal at node $N_1$ propagates to output Q of latch 230 when the signal output by inverter 237 transitions from high to low. This scheme ensures that latch 230 latches updated data at node N1 after the propagation of this data via latch 228. Accordingly, inverter 237 is designed to have a propagation time higher than the propagation time of the data-to-output-Q for latch 228, to insure the arrival of the clock signal to the clock input of latch 230, at a time equal to at least the set up time of latch 230.

Latch 232 latches the input signal on the transition of the $\overline{CLK}$ signal from high to low. The clock input of latch 232 is inverted such that the signal, that triggers the latching of the data by latch 232, transitions from low to high. The high to low transition of the $\overline{CLK}$ signal corresponds to a transition from high to low of the clock signal driven to the input of output buffer 208. Such transition from high to low is delayed by output buffer 208 with the second time delay.

Output buffer 204, which receives the input signal from second circuit 202, introduces the first time delay to the input signal for a transition of the input signal from low to high. In this case, muxflop 226 compensates the first time delay introduced by output buffer 204 by introducing a delay substantially equal to the second time delay in the following way. Since the logic value of the signal at node $N_1$ is 1, after the input signal has transitioned from 0 to 1, multiplexor 236 receives at its control input 254 a signal at logic 1. This signal causes multiplexor 236 to selectively output the signal from latch 234, which is the input signal passed via latches 232 and 234 that are controlled by the high-to-low transition of the $\overline{CLK}$ signal. Since the high-to-low transition of the $\overline{CLK}$ signal is itself delayed by the second time delay, introduced by output buffer 208, muxflop 226 drives to the output buffer 204 a signal delayed with a second time delay. Note that latch 234 introduces a small delay in the data path of the input signal, relative to the second delay, and therefore the delay introduced by this latch may be considered negligible for purposes of this description. Inverter 239 ensures that latch 234 latches the signal driven to gate D after this signal has been passed through latch 232. In this way, it is insured that latch 234 latches data at node N4 when such data is already stable (after the latch 232 has latched therein the input signal). Accordingly, it is insured that an updated input signal is present at input D of latch 234 at a time greater than or equal to the setup time of latch 234.

When the input signal transitions from high to low, the output buffer 204 delays this signal by the second time delay corresponding to the propagation of a high-to-low transition via output buffer 204. In this case, muxflop circuit 226 introduces a compensating first time delay in the input signal's path. Since node $N_1$ is set to 0, after the high-to-low transition of the input signal multiplexor 236 selectively outputs the signal fed to the N2 input of multiplexor 236, to output buffer 204. This signal is delayed by the first time delay, as a low-to-high transition of the CLK signal is delayed by output buffer 210 with the first time delay.

Figure 4:
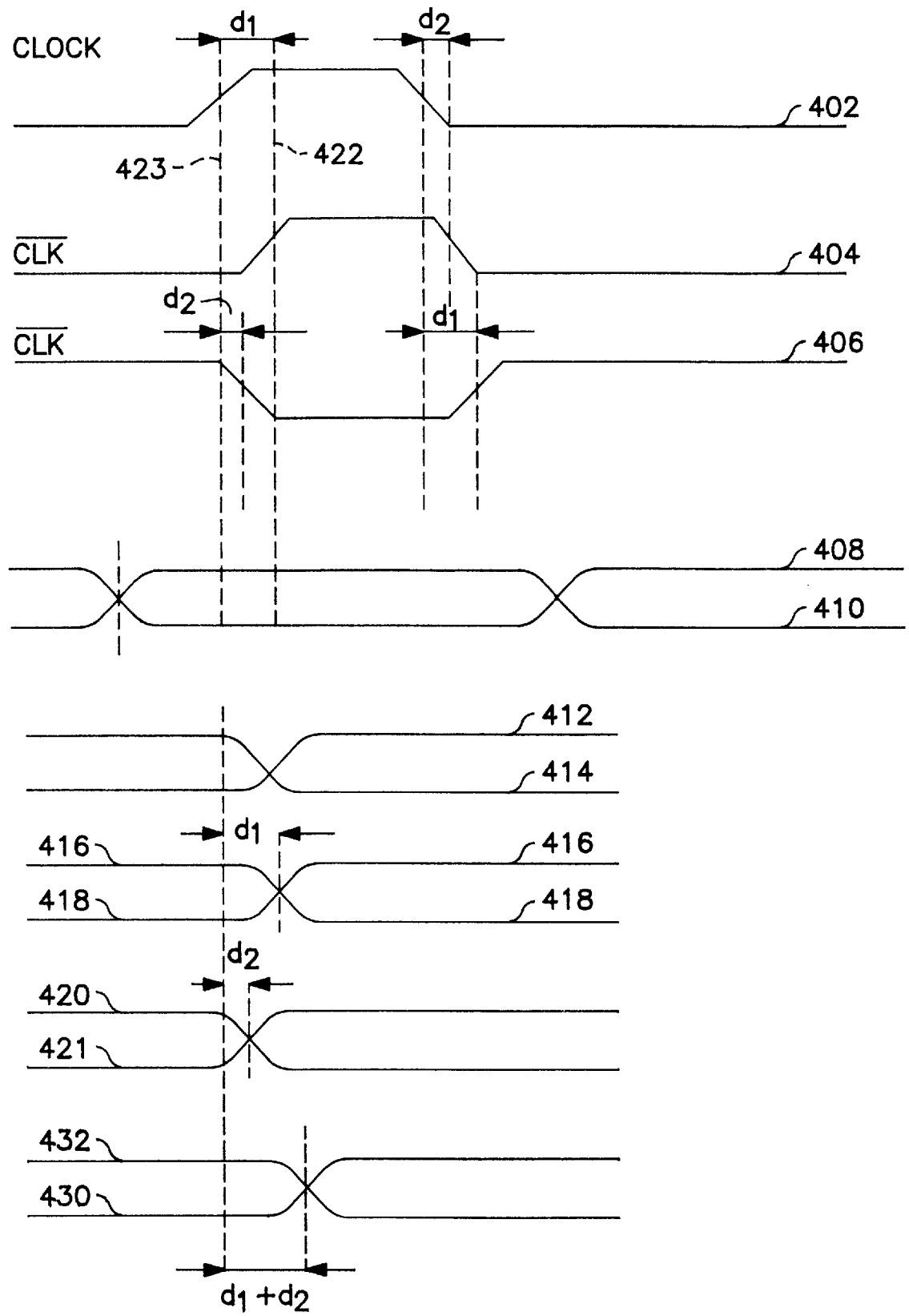
FIG. 4 diagrammatically illustrates clock signals and input signals at various stages in the device of FIG. 2 according to one embodiment of the present invention.

FIG. 4 diagrammatically illustrates various signals in the circuit for compensating signal delay mismatch according to the present invention. The signal CLOCK 402 is the signal driven by the clock source 218 to the input of output buffer 210 (not shown) via inverters 211, 213, 215, and 212 (shown in FIG. 2). Output buffer 210 receives at an input thereof the CLOCK signal and drives this signal to its output, delayed by a first delay d1 with respect to the CLOCK signal, when the CLOCK signal transitions from low to high. The CLK signal is delayed by a second time delay d2 with respect to the CLOCK signal when the CLOCK signal transitions from high to low. A $\overline{CLK}$ signal 404 driven by output buffer 208 is 180° out of phase relative to the CLOCK and CLK signals. A transition from low to high of the signal at the input of output buffer 208 causes the $\overline{CLK}$ signal to be delayed by the first time delay d1 relative to the CLOCK signal, while a transition from high to low causes the $\overline{CLK}$ signal to be delayed by the second time delay d2.

An INPUT signal, such as signal 408, which may be driven to data input (D) of the muxflop 226, is also shown in FIG. 4. The INPUT signal may be transitioning from high to low, or low to high, as shown in FIG. 4. FIG. 4 also shows signals 412 and 414 which are the input signals seen at the output of the output buffer 204, in both the high to low and low to high transitions. In the absence of the second circuit according to the present invention, signals 408 and 410 would be driven directly to the input of output buffer 204. Signals 412 and 414 do not cross each other in the middle of the transition between low to high and high to low due to the different delays for these transitions introduced by output buffers 210 and 200. Signals 416 and 418 are the INPUT and the $\overline{INPUT}$ signals seen at node N1 of FIG. 3, after being passed through latch 228, which is controlled by the CLK signal 404. As the rising edge of the CLK signal controls the latching of data by latch 228, signals 416 and 418 cross each other at a point in time having the first time delay relative to the transition of the CLOCK signal. The first time delay is introduced by output buffer 210 when the CLOCK signal transitions from low and high. Note that signals 416 and 418 cross each other in the middle of their transition, as the signals INPUT or $\overline{INPUT}$ signals themselves are not passed via output buffers 210 or 208 but rather these signals are passed through latch 228.

FIG. 4 also shows INPUT 421 and $\overline{INPUT}$ 420 signals at node N4 of muxflop circuit 226 illustrated in FIG. 3. The INPUT and $\overline{INPUT}$ signals at node 4 are delayed by the second time delay d2 due to the high to low transition of the CLOCK signal via output buffer 208. Furthermore, FIG. 4 shows the delayed INPUT and $\overline{INPUT}$ signals 432 and 430 output by output buffer 204, when circuit 202 compensates the delays introduced by output buffer 204.

Figure 5:
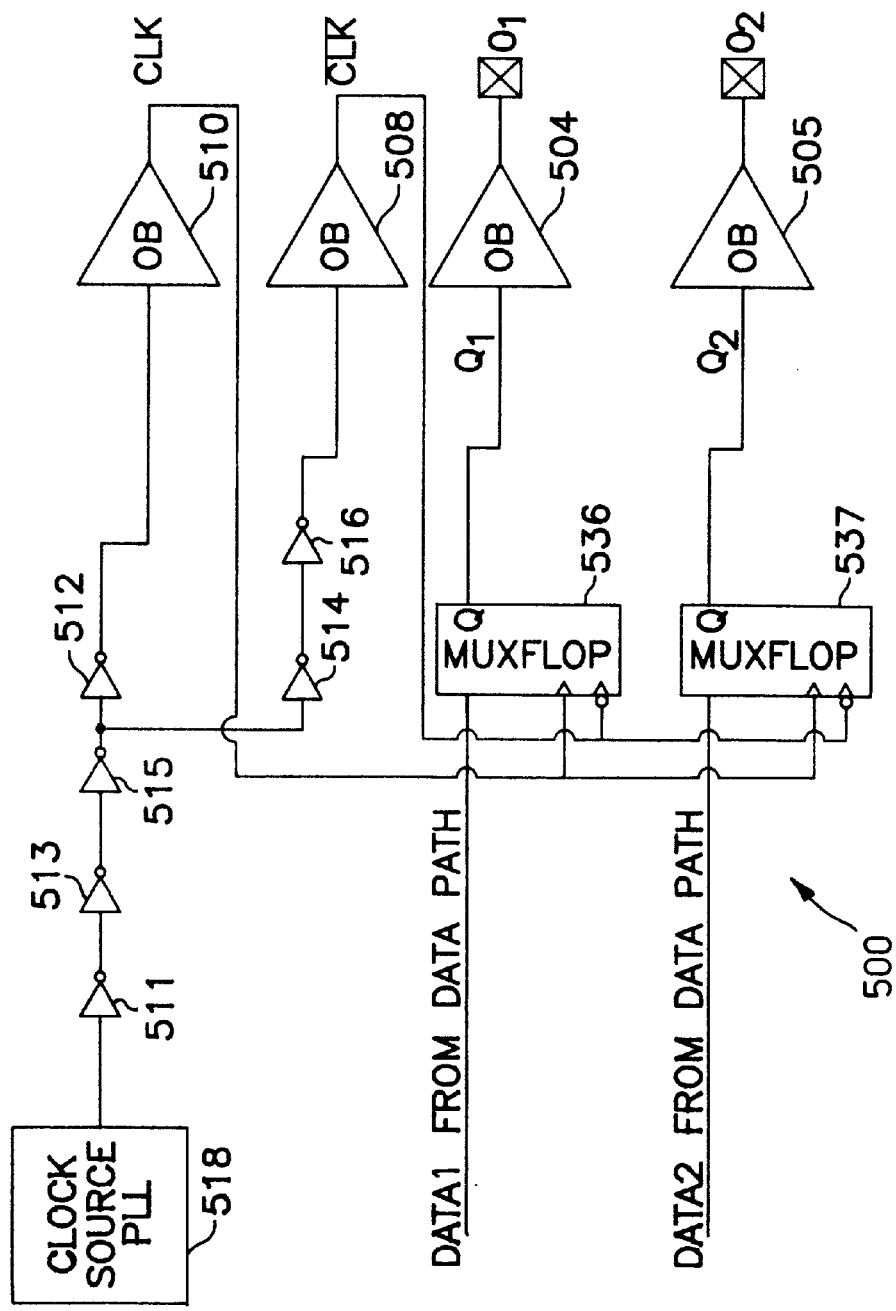
FIG. 5 shows a block diagram for a second embodiment of a device according to one embodiment of the present invention.

FIG. 5 shows a block diagram for an alternative embodiment of a circuit for compensating signal delay mismatch 500. Similarly, to the embodiment illustrated in FIG. 3, circuit 500 utilizes output buffers 510 and 508 for passing therethrough sequencing signals generated by clock source 518. One sequencing signal is passed to an input of buffer 510 via inverters 511, 513, 515 and 512. Another sequencing signal is passed to an input of output buffer 508 via inverters 511, 513, 515, 514 and 516. The output buffers 510 and 508 generate the signals CLK and $\overline{CLK}$ respectively. These signals are driven to muxflops 536 and 537 which are substantially similar to the muxflop described above. In this particular embodiment, muxflops 536 and 537 receive signals DATA 1 and DATA 2 from a data path. These signals may be opposite phase, as shown in this example. Circuit 500 ensures that the signals transition from low to high or high to low at substantially the same time at the outputs $O_1$ and $O_2$ of output buffers 504 and 505 respectively. The operation of circuit 500 for DATA 1 and DATA 2 signals is substantially identical with the operation of the embodiment illustrated in FIGS. 2–4.

Figure 6:
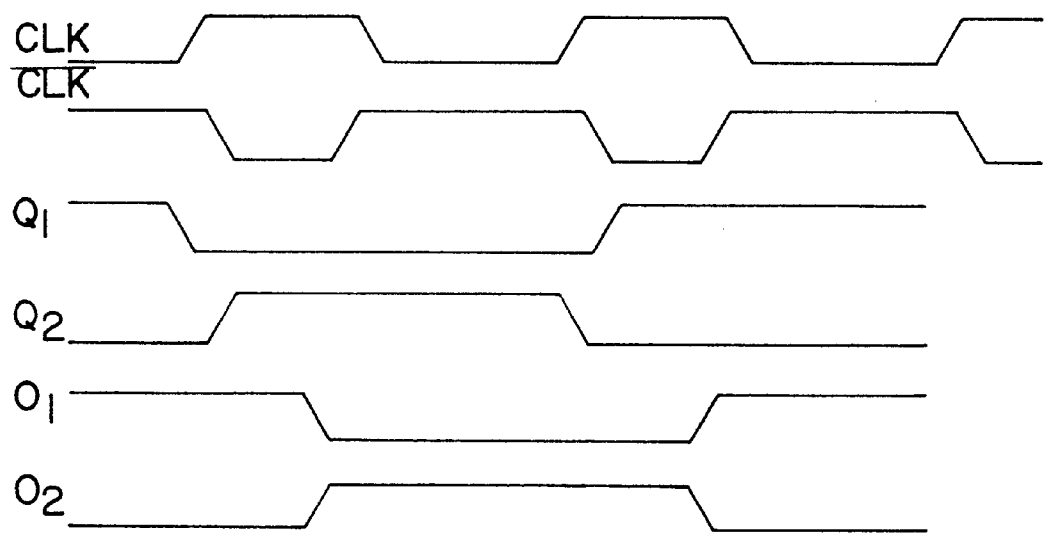
FIG. 6 illustrates in diagrammatic form signal waveforms for a device according to one embodiment of the present invention.

FIG. 6 illustrates in diagrammatic form clock and signal waveforms in connection with the embodiment illustrated in FIG. 5. Signals CLK and $\overline{CLK}$, as explained above, are skewed due to the different delay introduced by buffers 510 and 508 with respect to opposite transitions of the signal. The signals Q1 and Q2 are of opposite phase in this example with respect to their transition from high to low and low to high. The skew between these signals is introduced by muxflops 536 and 537 to compensate the delays introduced in the DATA 1 and DATA 2 paths by output buffers 504 and 505 respectively. FIG. 6 also displays these signals transitioning at a substantially same point in time at the output $O_1$ and $0_2$ of output buffers 504 and 505 respectively.

Figure 7:
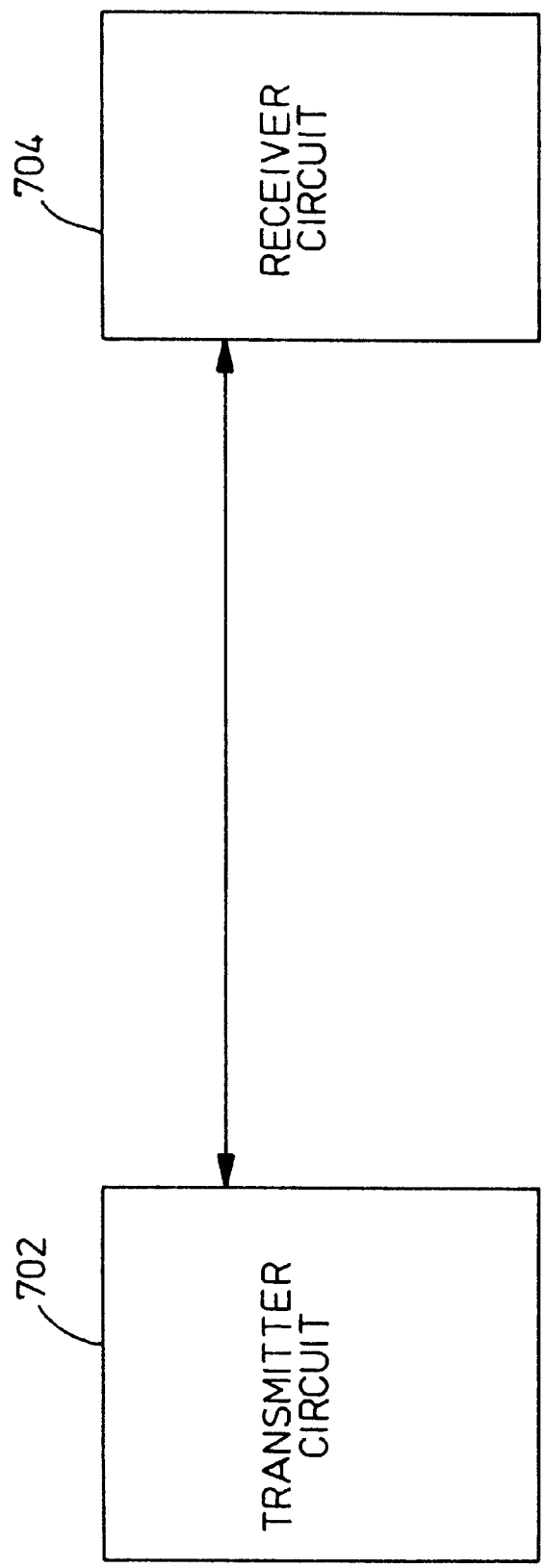
FIG. 7 illustrates in diagrammatic form, a transmitter coupled to a receiver incorporating an embodiment of a device according to the present invention.

FIG. 7 shows a transmitter circuit 702 coupled to a receiver circuit 704 incorporating an embodiment of a device according to the present invention.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

I claim:

1. A device to reduce signal delay mismatch, the device comprising:

a first circuit coupled to a second circuit, said second circuit configured to introduce a first delay when a signal input thereto from the first circuit, transitions from a first to a second logic level and to introduce a second delay when said signal transitions from said second to said first logic level, said first circuit configured to receive an input signal and to introduce said first delay when said input signal transitions from said second to said first logic level and configured to introduce said second delay when said input signal transitions from said first to said second logic level, said first circuit includes a third circuit configured to receive said input signal and first and second sequencing signals and responsively to output said signal coupled to said second circuit with one of said first and second delays when said third circuit is sequenced by one of a second and first sequencing signals respectively.

2. A device to reduce signal delay mismatch, the device comprising:

a first circuit coupled to a second circuit, said second circuit configured to introduce a first delay when a signal input thereto from the first circuit, transitions from a first to a second logic level and to introduce a second delay when said signal transitions from said second to said first logic level, said first circuit configured to receive an input signal and to introduce said first delay when said signal transitions from said second to said first logic level and configured to introduce said second delay when said input signal transitions from said first to said second logic level, said first circuit includes first and second delay stages configured to receive said input signal and to be sequenced by first and second sequencing signals respectively, and responsively to introduce said first and second delays respectively to said input signal.

3. The device of claim 2 wherein said first circuit further includes a selecting device coupled to said first and second delay stages and to a control signal, said selecting device configured to selectively output a signal provided by one of said first and second delay stages.

4. The device of claim 2 wherein said first circuit includes first and second clock delay stages configured to receive a clock signal and a 180 version of said clock signal respectively and responsively to generate said first and second sequencing signals.

5. The device of claim 3 wherein said first and second delay stages include first and second latching devices respectively, each of said first and second latching devices including a master and a slave latch, said master latch of said first latching device having an output configured to generate said control signal.

6. The device of claim 5 wherein said slaves of said first and second latching devices have outputs coupled to said selecting device.

7. The device of claim 4 wherein said second circuit, and said first and second clock delay stages are substantially similar output buffers.

8. A system comprising:

a transmitter circuit; and a receiver circuit, coupled to said transmitter circuit, the receiver circuit including, a device to reduce signal delay mismatch, the device including, a first circuit coupled to said second circuit, said second circuit configured to introduce a first delay when a signal input thereto from the first circuit, transitions from a first to a second logic level and to introduce a second delay when said signal transitions from said second to said first logic level, said first circuit configured to receive an input signal and to introduce said first delay when said input signal transitions from said second to said first logic level and configured to introduce said second delay when said input signal transitions from said first to said second logic level, said first circuit includes a third circuit configured to receive said input signal and first and second sequencing signals and responsively to output said signal coupled to said second circuit with one of said first and second delays when said third circuit is sequenced by one of a second and first sequencing signals respectively.

9. A system comprising:

a transmitter circuit; and a receiver circuit, coupled to said transmitter circuit, the receiver circuit including, a device for reducing signal delay mismatch, the device including, a first circuit coupled to said second circuit, said second circuit configured to introduce a first delay when a signal input thereto from the first circuit, transitions from a first to a second logic level and to introduce a second delay when said signal transitions from said second to said first logic level, said first circuit configured to receive an input signal and to introduce said first delay when said input signal transitions from said second to said first logic level and configured to introduce said second delay when said input signal transitions from said first to said second logic level, said first circuit includes first and second delay stages configured to receive said input signal and to be sequenced by first and second sequencing signals respectively, and responsively to introduce said first and second delays respectively to said input signal.

10. The system of claim 9 wherein said first circuit further includes a selecting device coupled to said first and second delay stages and to a control signal, said selecting device configured to selectively output a signal output by one of said first and second delay stages.

11. The system of claim 9 wherein said first circuit includes first and second clock delay stages configured to receive a clock signal and a 180 version of said clock signal respectively and responsively to generate said first and second sequencing signals.

12. The system of claim 10 wherein said first and second delay stages include first and second latching devices respectively, each of said first and second latching devices including a master and a slave latch, said master latch of said first latching device having an output configured to generate said control signal.

13. The system of claim 12 wherein said slaves of said first and second latching devices have outputs coupled to said selecting device.

14. The system of claim 11 wherein said second circuit, and said first and second clock delay stages are substantially similar output buffers.

* * * * *